US012613287B2

(12) United States Patent
Jang et al.

(10) Patent No.: US 12,613,287 B2
(45) Date of Patent: Apr. 28, 2026

(54) APPARATUS FOR DIAGNOSING ABNORMALITY OF BATTERY CELL AND METHOD THEREOF

(71) Applicants:Hyundai Motor Company, Seoul (KR); Kia Corporation, Seoul (KR)

(72) Inventors: Hyun Jun Jang, Daegu (KR); Chang Ho Jung, Hwaseong-Si (KR); Si Joong Kim, Seoul (KR); Hyun Jun Jo, Gimpo-Si (KR); Woo Sung Kim, Suwon-Si (KR); Tae Kyu Kang, Suwon-Si (KR)

(73) Assignees: Hyundai Motor Company;, Seoul (KR); Kia Corporation, Seoul (KR)

( * ) Notice: Subject to any disclaimer, the term of this patent is extended or adjusted under 35 U.S.C. 154(b) by 155 days.

(21) Appl. No.: 18/436,615

(22) Filed: Feb. 8, 2024

(65) Prior Publication Data

US 2025/0102589 A1     Mar. 27, 2025

(30) Foreign Application Priority Data

Sep. 25, 2023     (KR) ......................... 10-2023-0128419

(51) Int. Cl.
    *G01R 31/392*     (2019.01)
    *G01R 31/396*     (2019.01)
(52) U.S. Cl.
    CPC ......... *G01R 31/392* (2019.01); *G01R 31/396* (2019.01)

(58) Field of Classification Search
    None
    See application file for complete search history.

(56) References Cited

U.S. PATENT DOCUMENTS

2018/0233786 A1*  8/2018  Schwichtenhövel ........................
                                                    H01M 10/4285
2020/0235441 A1*  7/2020  Rahimian ........... H01M 10/425
2021/0311129 A1*  10/2021  Yezerets .............. G01R 31/385
2021/0325470 A1*  10/2021  Patil ................... G01R 31/3648

OTHER PUBLICATIONS

David Ansean, et al. "Lithium-Ion Battery Degradation Indicators Via Incremental Capacity Analysis" ; IEEE Transactions on Industry Applications, vol. 55, No. 3, May/Jun. 2019; pp. 2992 to 3002.
Theodoros Kalogiannis, et al. "Incremental Capacity Analysis of a Lithium-Ion Battery Pack for Different Charging Rates" (ECS, 2017) pp. 403-412.

* cited by examiner

*Primary Examiner* — Nasima Monsur
(74) *Attorney, Agent, or Firm* — MORGAN, LEWIS & BOCKIUS LLP

(57)             ABSTRACT
An apparatus for diagnosing an abnormality of a battery cell and a method thereof may prevent thermal runaway of the battery cell in advance by generating an incremental capacity analysis (ICA) profile corresponding to each battery cell in a process of charging a plurality of battery cells, setting at least one voltage section within each ICA profile, determining a relative comparison value of an ICA value for each voltage section, and diagnosing an abnormality of each battery cell based on the relative comparison value of the ICA value.

18 Claims, 7 Drawing Sheets

| ONE CHARGING SEQUENCE | | | | | |
|---|---|---|---|---|---|
| RELATIVE COMPARISON VALUE OF ICA VALUE | Cell 1 | Cell 2 | Cell 3 | . . . | ENTIRE CELL |
| SECTION 1 | 100.0% | 98.0% | 100.5% | | . . . |
| SECTION 2 | 100.1% | 99.0% | 101.0% | | . . . |
| SECTION 3 | 99.8% | 97.0% | 100.0% | | . . . |
| SECTION 4 | 99.9% | 99.2% | 100.0% | | . . . |
| SECTION 5 | 101.0% | 100.0% | 100.8% | | . . . |

FIG.4

| DDQT | CHARGE 1 | CHARGE 2 | CHARGE 3 | CHARGE 4 | CHARGE 5 | CHARGE 6 | ... | CHARGE 10 |
|---|---|---|---|---|---|---|---|---|
| Cell 1 | 99.8% | 99.9% | ... | ... | ... | ... | ... | ... |
| Cell 2 | 99.9% | 97.9% | ... | ... | ... | ... | ... | ... |
| ... | | | ... | ... | ... | ... | ... | ... |
| ENTIRE CELL | 100.1% | 100.0% | ... | ... | ... | ... | ... | ... |

FIG.5

START

GENERATE ICA PROFILE
CORRESPONDING TO EACH BATTERY
CELL WHEN CHARGING BATTERY
INCLUDING PLURAL BATTERY CELLS ~601

SET AT LEAST ONE VOLTAGE
SECTION WITHIN EACH ICA PROFILE ~602

DETERMINE RELATIVE COMPARISON VALUE
OF ICA VALUE FOR EACH VOLTAGE SECTION ~603

DIAGNOSE ABNORMALITY OF EACH
BATTERY CELL BASED ON RELATIVE
COMPARISON VALUE OF ICA VALUE ~604

END

APPARATUS FOR DIAGNOSING ABNORMALITY OF BATTERY CELL AND METHOD THEREOF

CROSS-REFERENCE TO RELATED APPLICATION

The present application claims priority to Korean Patent Application No. 10-2023-0128419, filed on Sep. 25, 2023, the entire contents of which is incorporated herein for all purposes by this reference.

BACKGROUND OF THE PRESENT DISCLOSURE

Field of the Present Disclosure

The present disclosure relates to a technology for diagnosing an abnormality of a battery cell based on an incremental capacity analysis (ICA) profile.

Description of Related Art

In general, an electric vehicle, which is a vehicle driven by electrical energy, is provided with a battery including a plurality of battery cells that store electrical energy. In the instant case, the battery cell includes a positive electrode current collector, a negative electrode current collector, a separator, an active material, an electrolyte, and the like, and may be repeatedly charged and discharged through electrochemical reactions between components. In the instant case, to protect the plurality of battery cells from external shocks such as heat, vibration, and the like, a battery module may be formed by combining the plurality of battery cells into one. To systematically manage a plurality of battery modules, a battery pack (i.e., a battery system) may be formed by use of the plurality of battery modules, a battery management system (BMS), and a cooling device.

Because an electric vehicle is driven using electrical energy stored in a battery as a power source, the performance of the vehicle is determined by the performance of the battery. Therefore, to improve the performance of an electric vehicle, it is required to manage the battery to maximize the performance.

In recent years, because battery cells with excellent performance are used to improve the power source of a vehicle, and the number of battery cells increases gradually, it is more required to manage a battery. Such battery management is generally performed by a battery management system (BMS).

The battery management system measures cell state information including a voltage, a current, a temperature, and the like of a battery cell from a battery module provided in an electric vehicle, utilizes the cell state information and option values for controlling battery cells to manage the charging/discharging of the battery cells, and performs cell balancing to maintain balance between the battery cells. In the instant case, the cell balancing is one of the control operations of a battery management system that equalizes the voltages or charge amounts of battery cells. Furthermore, each battery cell of a battery module may have differences in electrical characteristics even when the battery cells are manufactured under the same manufacturing conditions and environment, and may also have differences in electrical characteristics even when the battery cells are mounted and operated in an electric vehicle.

Due to such differences in electrical characteristics, even when battery cells are charged and discharged with the same current, voltage imbalance or residual charge imbalance may occur between interconnected battery cells, and the voltage imbalance or residual charge imbalance between battery cells may cause the available voltage range of battery cells to decrease or the charging and discharging cycle to be shorter.

Meanwhile, because a plurality of battery cells are connected to each other in series and parallel in one battery, when thermal runaway occurs in one battery cell, micro short circuit (MSC) or internal short circuit (ISC) may be caused by the lithium plating phenomenon and lead to thermal runaway of the entire battery.

Therefore, there is required an active diagnostic technology through analysis of the electrochemical behavior of a battery cell.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing an apparatus for diagnosing an abnormality of a battery cell and a method thereof which may prevent thermal runaway of the battery cell in advance by generating an incremental capacity analysis (ICA) profile corresponding to each battery cell in a process of charging a plurality of battery cells, setting at least one voltage section within each ICA profile, determining a relative comparison value of an ICA value for each voltage section, and diagnosing an abnormality of each battery cell based on the relative comparison value of the ICA value.

Another aspect of the present disclosure provides an apparatus for diagnosing an abnormality of a battery cell and a method thereof which may prevent thermal runaway of the battery cell in advance by generating an ICA profile corresponding to each battery cell when charging the plurality of battery cells in a first (state of charge) SOC section, setting at least one voltage section within each ICA profile, determining a relative comparison value of an ICA value for each voltage section, and diagnosing that an abnormality occurs in the battery cell in which the relative comparison value of the ICA value exceeding a threshold value among relative comparison values of ICA values for voltage sections exceeds a reference number.

Yet another aspect of the present disclosure provides an apparatus for diagnosing an abnormality of a battery cell and a method thereof which may prevent thermal runaway of the battery cell in advance by generating an ICA profile corresponding to each battery cell when charging the plurality of battery cells in a second SOC section within the first SOC section, setting at least one voltage section within each ICA profile, determining a relative comparison value of an ICA value for each voltage section, and diagnosing that an abnormality occurs in the battery cell in which the relative comparison value of the ICA value exceeding a threshold value among relative comparison values of ICA values for voltage sections exists.

Yet another aspect of the present disclosure provides an apparatus for diagnosing an abnormality of a battery cell and a method thereof which may prevent thermal runaway of each battery cell in advance by generating a first ICA profile during a first charging process of the battery cell, setting at least one voltage section within the first ICA profile, determining a relative comparison value of a first ICA value for each voltage section, generating a second ICA profile during a second charging process of the battery cell, setting at least one voltage section within the second ICA profile, determining a relative comparison value of a second ICA value for each voltage section, determining an average of a difference (i.e., an amount of change in the relative comparison value of the ICA value for each battery cell) between the relative comparison value of the first ICA value and the relative comparison value of the second ICA value of each battery cell for each voltage section, determining a score corresponding to the amount of change in the relative comparison value of the ICA value of each battery cell compared to the average, and diagnosing that an abnormality occurs in the battery cell in which a cumulative score exceeds a reference value.

Yet another aspect of the present disclosure provides an apparatus for diagnosing an abnormality of a battery cell and a method thereof which may prevent thermal runaway of each battery cell in advance by generating an ICA profile corresponding to each battery cell in a process of charging a plurality of battery cells, setting at least one voltage section within each ICA profile, determining a relative comparison value of an ICA value for each voltage section, determining a score corresponding to a number of relative comparison values of ICA values that continuously increase or decrease while the plurality of battery cells are charged a reference number of times for each voltage section, and diagnosing that an abnormality occurs in the battery cell in which a cumulative score for each voltage section exceeds a reference value.

Yet another aspect of the present disclosure provides an apparatus for diagnosing an abnormality of a battery cell and a method thereof which may prevent thermal runaway of each battery cell in advance by generating an ICA profile corresponding to each battery cell in a process of charging a plurality of battery cells, setting at least one voltage section within each ICA profile, determining a relative comparison value of an ICA value for each voltage section, counting relative comparison values of ICA values that are out of a reference range for each voltage section while the plurality of battery cells are charged a reference number of times, determining a score corresponding to the counting value, and diagnosing that an abnormality occurs in the battery cell in which the cumulative score for each voltage section exceeds a reference value.

The technical problems to be solved by the present disclosure are not limited to the aforementioned problems, and any other technical problems not mentioned herein will be clearly understood from the following description by those skilled in the art to which the present disclosure pertains. Also, it may be easily understood that the objects and advantages of the present disclosure may be realized by the units and combinations thereof recited in the claims.

According to an aspect of the present disclosure, an apparatus for diagnosing an abnormality of a battery cell includes a battery including a plurality of battery cells, and a controller that generates an incremental capacity analysis (ICA) profile corresponding to each battery cell when charging the battery, sets at least one voltage section within each ICA profile, determines a relative comparison value of an ICA value for each voltage section, and diagnoses an abnormality of each battery cell based on the relative comparison value of the ICA value.

According to an exemplary embodiment of the present disclosure, the controller may be configured to count a relative comparison value that exceeds a first threshold value among relative comparison values of ICA values for each voltage section, and diagnose that an abnormality occurs in the battery cell whose counting number exceeds a reference number.

According to an exemplary embodiment of the present disclosure, the controller may diagnose that an abnormality occurs in a battery cell in which a relative comparison value that exceeds a second threshold value among relative comparison values of ICA values for each voltage section exists.

According to an exemplary embodiment of the present disclosure, the controller may be configured to determine an average of difference values between a relative comparison value of the ICA value for each voltage section determined during previous charging of the battery and a relative comparison value of the ICA value for each voltage section determined during current charging of the battery, determine a score corresponding to an amount of change in the relative comparison value of the ICA value with respect to the average, and diagnose that an abnormality occurs in the battery cell whose cumulative score exceeds a reference value.

According to an exemplary embodiment of the present disclosure, the controller may assign a higher score as the amount of change in the relative comparison value of the ICA value with respect to the average increases.

According to an exemplary embodiment of the present disclosure, the controller may be configured to determine a score corresponding to a number (N) of relative comparison values of ICA values that continuously increase or decrease for each voltage section when the battery is charged a reference number of times, and diagnose that an abnormality occurs in the battery cell in which a cumulative score for each voltage section exceeds a reference value.

According to an exemplary embodiment of the present disclosure, the controller may assign a higher score as the number (N) increases.

According to an exemplary embodiment of the present disclosure, the controller may assign the score by further considering a slope of the relative comparison values of the ICA values that continuously increase or decrease.

According to an exemplary embodiment of the present disclosure, the controller may be configured to count the relative comparison value of the ICA value which is out of a reference range for each voltage section when the battery is charged a reference number of times, determine a score corresponding to a counting value (M), and diagnose that an abnormality occurs in the battery cell in which a cumulative score for each voltage section exceeds a reference value.

According to an exemplary embodiment of the present disclosure, the controller may set ranges of each voltage section differently from each other.

According to an aspect of the present disclosure, a method of diagnosing an abnormality of a battery cell includes generating, by a controller, an incremental capacity analysis (ICA) profile corresponding to each battery cell when charging a battery including a plurality of battery cells, setting, by the controller, at least one voltage section within each ICA profile, determining, by the controller, a relative comparison value of an ICA value for each voltage section, and diagnosing, by the controller, an abnormality of each battery cell based on the relative comparison value of the ICA value.

According to an exemplary embodiment of the present disclosure, the diagnosing of the abnormality of each battery cell may include counting, by the controller, a relative comparison value that exceeds a first threshold value among relative comparison values of ICA values for each voltage section, and diagnosing, by the controller, that an abnormality occurs in the battery cell whose counting number exceeds a reference number.

According to an exemplary embodiment of the present disclosure, the diagnosing of the abnormality of each battery cell may include diagnosing, by the controller, that an abnormality occurs in a battery cell in which a relative comparison value that exceeds a second threshold value among relative comparison values of ICA values for each voltage section exists.

According to an exemplary embodiment of the present disclosure, the diagnosing of the abnormality of each battery cell may include determining, by the controller, an average of difference values between a relative comparison value of the ICA value for each voltage section determined during previous charging of the battery and a relative comparison value of the ICA value for each voltage section determined during current charging of the battery, determining, by the controller, a score corresponding to an amount of change in the relative comparison value of the ICA value with respect to the average, and diagnosing, by the controller, that an abnormality occurs in the battery cell whose cumulative score exceeds a reference value.

According to an exemplary embodiment of the present disclosure, the determining of the score may include assigning, by the controller, a higher score as the amount of change in the relative comparison value of the ICA value with respect to the average increases.

According to an exemplary embodiment of the present disclosure, the diagnosing of the abnormality of each battery cell may include determining, by the controller, a score corresponding to a number (N) of relative comparison values of ICA values that continuously increase or decrease for each voltage section when the battery is charged a reference number of times, and diagnosing, by the controller, that an abnormality occurs in the battery cell in which a cumulative score for each voltage section exceeds a reference value.

According to an exemplary embodiment of the present disclosure, the determining of the score may include assigning, by the controller, a higher score as the number (N) increases.

According to an exemplary embodiment of the present disclosure, the assigning of the score may include assigning, by the controller, the score by further considering a slope of the relative comparison values of the ICA values that continuously increase or decrease.

According to an exemplary embodiment of the present disclosure, the diagnosing of the abnormality of each battery cell may include counting, by the controller, the relative comparison value of the ICA value which is out of a reference range for each voltage section when the battery is charged a reference number of times, determining, by the controller, a score corresponding to a counting value (M), and diagnosing, by the controller, that an abnormality occurs in the battery cell in which a cumulative score for each voltage section exceeds a reference value.

According to an exemplary embodiment of the present disclosure, the setting of the voltage section may include setting, by the controller, ranges of each voltage section differently from each other.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

FIG. 4 is a diagram illustrating an example of a relative comparison value of the ICA value determined for each voltage section by the controller provided in an apparatus for diagnosing an abnormality of a battery cell according to an exemplary embodiment of the present disclosure;

FIG. 5 is a diagram illustrating an example of a table showing relative comparison values of ICA values of each battery cell in a first voltage section for each number of charging times generated by a controller provided in an apparatus for diagnosing an abnormality of a battery cell according to an exemplary embodiment of the present disclosure;

Figure 1:
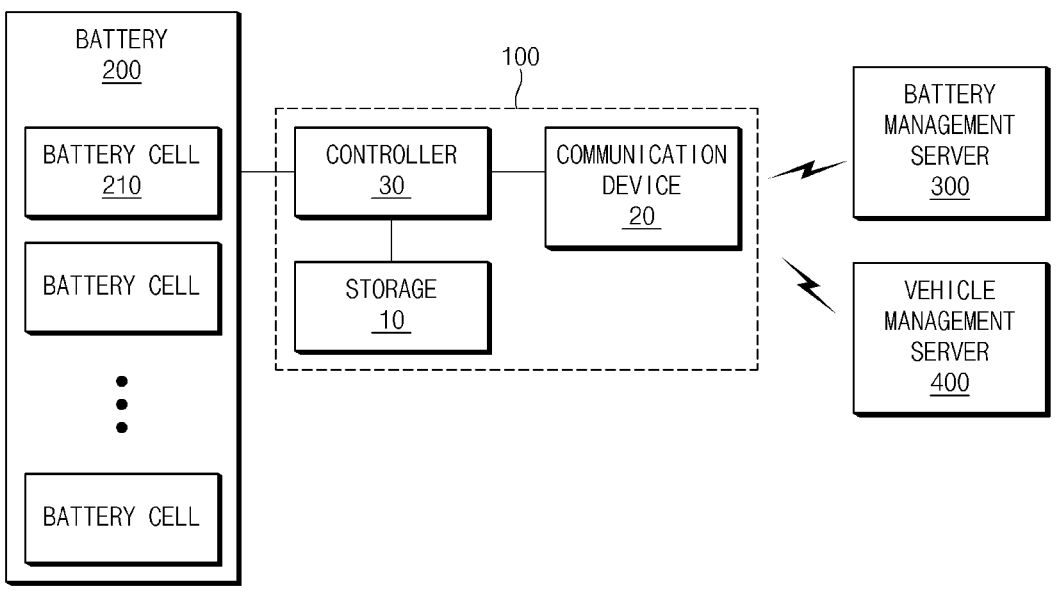
FIG. 1 is a block diagram illustrating an apparatus for diagnosing an abnormality of a battery cell according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, various exemplary embodiments of the present disclosure will be described in detail with reference to the exemplary drawings. In adding the reference numerals to the components of each drawing, it should be noted that the identical or equivalent component is designated by the identical numeral even when they are displayed on other drawings. Furthermore, in describing the exemplary embodiment of the present disclosure, a detailed description of the related known configuration or function will be omitted when it is determined that it interferes with the understanding of the exemplary embodiment of the present disclosure.

Furthermore, terms, such as first, second, A, B, (a), (b) or the like may be used herein when describing components of the present disclosure. The terms are provided only to distinguish the elements from other elements, and the essences, sequences, orders, and numbers of the elements are not limited by the terms. Furthermore, unless defined otherwise, all terms used herein, including technical or scientific terms, include the same meanings as those generally understood by those skilled in the art to which the present disclosure pertains. The terms defined in the generally used dictionaries should be construed as including the meanings that coincide with the meanings of the contexts of the related technologies, and should not be construed as ideal or excessively formal meanings unless clearly defined in the specification of the present disclosure.

FIG. 1 is a block diagram illustrating an apparatus for diagnosing an abnormality of a battery cell according to an exemplary embodiment of the present disclosure.

As shown in FIG. 1, an apparatus 100 for diagnosing an abnormality of a battery cell according to an exemplary embodiment of the present disclosure may include storage 10, a communication device 20, and a controller 30. In the instant case, depending on a scheme of implementing the apparatus 100 for diagnosing an abnormality of a battery cell according to an exemplary embodiment of the present disclosure, components may be combined with each other to be implemented as one, or some components may be omitted. For example, the apparatus 100 for diagnosing an abnormality of a battery cell may be implemented in a battery management system (BMS), or the BMS may be implemented to perform a function of the apparatus 100 for diagnosing an abnormality of a battery cell.

Regarding each component, the storage 10 may store various logic, algorithms and programs required in the processes of generating an incremental capacity analysis (ICA) profile corresponding to each battery cell 210 in a process of charging a plurality of battery cells 210 provided in a battery 200, setting at least one voltage section within each ICA profile, determining a relative comparison value of an ICA value for each voltage section, and diagnosing an abnormality of each battery cell 210 based on the relative comparison value of the ICA value. In the instant case, the storage 10 may store a diagnosis result by the controller 30.

Furthermore, the storage 10 may store various logic, algorithms and programs required in the processes of generating an ICA profile corresponding to each battery cell 210 when charging the plurality of battery cells 210 in a first SOC section, setting at least one voltage section within each ICA profile, determining a relative comparison value of an ICA value for each voltage section, diagnosing that an abnormality occurs in the battery cell 210 in which the relative comparison value of the ICA value exceeding a threshold value (e.g., 105%) among relative comparison values of ICA values for each voltage section exceeds a reference number.

Furthermore, the storage 10 may store various logic, algorithms and programs required in the processes of generating an ICA profile corresponding to each battery cell 210 when charging the plurality of battery cells 210 in a second SOC section within the first SOC section, setting at least one voltage section within each ICA profile, determining a relative comparison value of an ICA value for each voltage section, and diagnosing that an abnormality occurs in the battery cell 210 in which the relative comparison value of the ICA value exceeding a threshold value (e.g., 110%) among relative comparison values of ICA values for each voltage section exists.

Furthermore, the storage 10 may store various logic, algorithms and programs required in the processes of generating a first ICA profile during a first charging process of the battery cell 210, setting at least one voltage section within the first ICA profile, determining a relative comparison value of a first ICA value for each voltage section, generating a second ICA profile during a second charging process of the battery cell 210, setting at least one voltage section within the second ICA profile, determining a relative comparison value of a second ICA value for each voltage section, determining an average of a difference (i.e., an amount of change in the relative comparison value of the ICA value for each battery cell) between the relative comparison value of the first ICA value and the relative comparison value of the second ICA value of each battery cell 210 for each voltage section, determining a score corresponding to the amount of change in the relative comparison value of the ICA value of each battery cell 210 compared to the average, and diagnosing that an abnormality occurs in the battery cell 210 in which a cumulative score exceeds a reference value.

Furthermore, the storage 10 may store various logic, algorithms and programs required in the processes of generating an ICA profile corresponding to each battery cell 210 in a process of charging the plurality of battery cells 210, setting at least one voltage section within each ICA profile, determining a relative comparison value of an ICA value for each voltage section, determining a score corresponding to a number of relative comparison values of ICA values that continuously increase or decrease while the plurality of battery cells 210 are charged a reference number of times for each voltage section, and diagnosing that an abnormality occurs in the battery cell 210 in which a cumulative score for each voltage section exceeds a reference value.

Furthermore, the storage 10 may store various logic, algorithms and programs required in the processes of generating an ICA profile corresponding to each battery cell 210 in a process of charging the plurality of battery cells 210, setting at least one voltage section within each ICA profile, determining a relative comparison value of an ICA value for each voltage section, counting relative comparison values of ICA values that are out of a reference range for each voltage section while the plurality of battery cells 210 are charged a reference number of times, determining a score corresponding to the counting value, and diagnosing that an abnormality occurs in the battery cell 210 in which the cumulative score for each voltage section exceeds a reference value.

The communication device 20, which is a module for providing a communication interface with a battery management server 300 or a vehicle management server 400, may transmit the diagnosis result of the controller 30 to the battery management server 300 or the vehicle management server 400. For example, the communication device 20 may transmit a message recording information related to the battery cell 210 diagnosed as including an abnormality to the battery management server 300 or the vehicle management server 400. The communication device 20 may include at least one of a mobile communication module, a wireless Internet module, and a short-range communication module.

The mobile communication module may communicate with the battery management server 300 or the vehicle management server 400 through a mobile communication network constructed according to a technical standard or communication scheme for mobile communication (e.g., Global System for Mobile communication (GSM), Code Division Multi Access (CDMA), code division multi access 2000 (CDMA2000), enhanced voice-data optimized or enhanced voice-data only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTEA), and the like).

The wireless Internet module, which is a module for wireless Internet access, may communicate with the battery management server 300 or vehicle management server 400 through wireless LAN (WLAN), wireless-fidelity (Wi-Fi), Wi-Fi direct, Digital Living Network Alliance (DLNA), Wireless Broadband (WiBro), Worldwide Interoperability for Microwave Access (WiMAX), High Speed Downlink Packet Access (HSDPA), High Speed Uplink Packet Access (HSUPA), Long Term Evolution (LTE), Long Term Evolution-Advanced (LTE-A), and the like.

The short-range communication module may support short-range communication with the battery management server 300 or vehicle management server 400 by use of at least one of Bluetooth™, radio frequency identification (RFID), infrared data association (IrDA), ultra wideband (UWB), ZigBee, Near Field Communication (NFC), and wireless universal serial bus (USB) technology.

The controller 30 may perform overall control so that each component is configured to perform its function. The controller 30 may be implemented in a form of hardware or software, or may be implemented in a combination of hardware and software. The controller 30 may be implemented as a microprocessor, but is not limited thereto.

The controller 30 may be configured to generate an ICA profile corresponding to each battery cell 210 in a process of charging the plurality of battery cells 210, set at least one voltage section within each ICA profile, determine a relative comparison value of an ICA value for each voltage section, and diagnose an abnormality of each battery cell 210 based on the relative comparison value of the ICA value. In the instant case, the controller 30 may be configured to generate the ICA profile in a charging section where a current change and a temperature change (i.e., a change in a heat generation amount) are minimized, such as a constant power (CP) section during slow charging, a constant current (CC) section during fast charging, and the like.

Hereinafter, the operation of the controller 30 will be described with reference to FIG. 2, FIG. 3 and FIG. 4.

Figure 2:
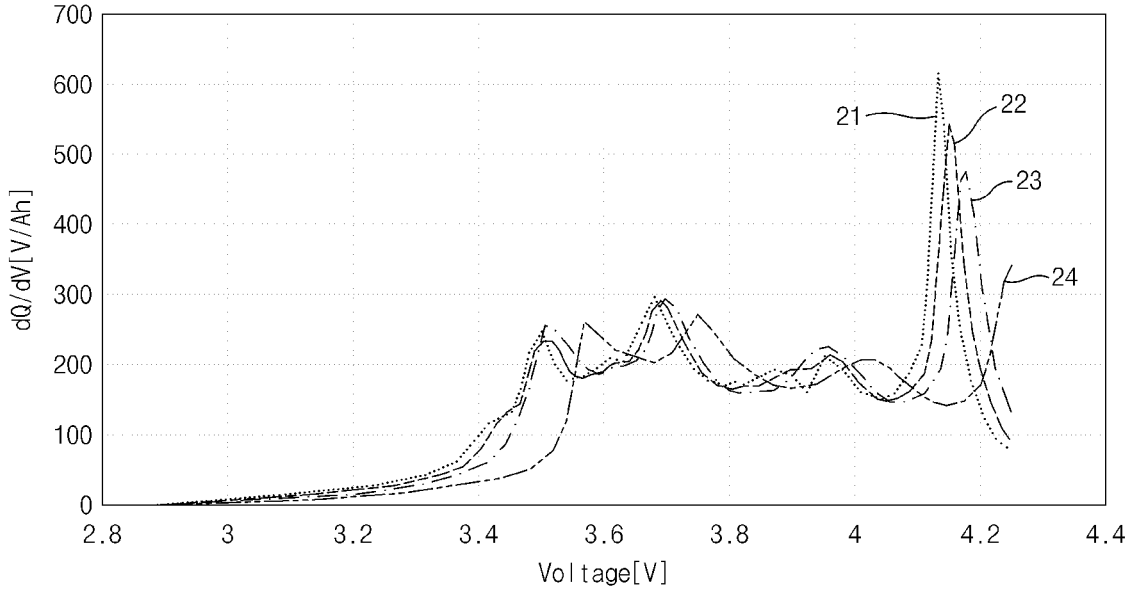
FIG. 2 is a diagram illustrating an example of an ICA profile of a first battery cell generated by a controller provided in an apparatus for diagnosing an abnormality of a battery cell according to an exemplary embodiment of the present disclosure.

FIG. 2 is a diagram illustrating an example of an ICA profile of a first battery cell generated by a controller provided in an apparatus for diagnosing an abnormality of a battery cell according to an exemplary embodiment of the present disclosure, where the ICA profile is a concept including an ICA curve.

In FIG. 2, the horizontal axis represents a voltage (V), and the vertical axis represents an amount (dQ) of change in capacity of the first battery cell (Cell_01) compared to an amount (dV) of change in voltage (dQ/dV). Furthermore, reference numeral '21' represents the ICA profile generated by the controller 30 in a process of charging the first battery cell at 0.1 C (Coulomb), reference numeral '22' represents the ICA profile generated by the controller 30 in a process of charging the first battery cell at 0.2 C, reference numeral '23' represents the ICA profile generated by the controller 30 in a process of charging the first battery cell at 0.3 C, and reference numeral '24' represents the ICA profile generated by the controller 30 in a process of charging the first battery cell at 1 C. In the instant case, the ICA may include the dQ/dV.

Figure 3:
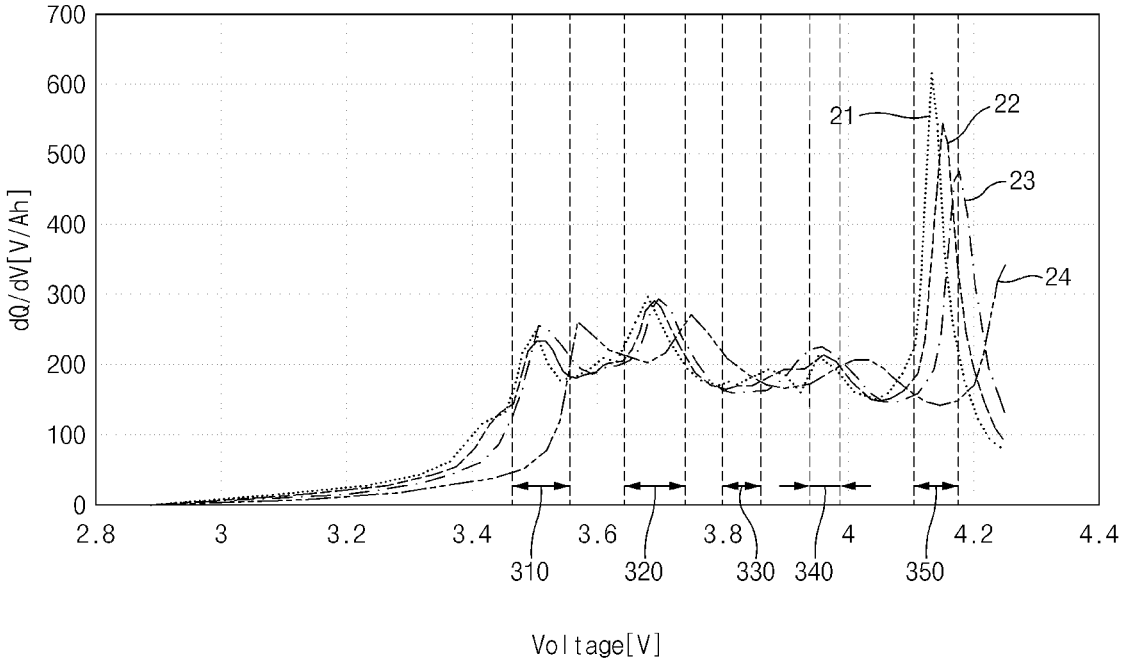
FIG. 3 is a diagram illustrating a voltage section set in an ICA profile by a controller provided in an apparatus for diagnosing an abnormality of a battery cell according to an exemplary embodiment of the present disclosure.

FIG. 3 is a diagram illustrating a voltage section set in an ICA profile by a controller provided in an apparatus for diagnosing an abnormality of a battery cell according to an exemplary embodiment of the present disclosure.

As shown in FIG. 3, the controller 30 may set a voltage section in which there is a large change in electrochemical characteristics in the ICA profile of the first battery cell as a target section. For example, the controller 30 may set the section where the voltage is 3.45 V to 3.55 V as a first voltage section 310, set the section where the voltage is 3.65 V to 3.75 V as a second voltage section 320, set the section where the voltage is 3.8 V to 3.85 V as a third voltage section 330, set the section where the voltage is 3.95 V to 4 V as a fourth voltage section 340, and set the section where the voltage is 4.1 V to 4.18 V as a fifth voltage section 350.

FIG. 3 illustrates an example of setting five voltage sections, but the number of voltage sections may vary depending on the designer's intention. Furthermore, the ranges of voltage sections may be set to be different from each other, or may all be set to the same voltage value (e.g., 0.1 V, 0.08 V, 0.05 V, 0.01 V, 0.005 V, 0.001 V, or the like).

FIG. 4 is a diagram illustrating an example of a relative comparison value of the ICA value determined for each voltage section by the controller provided in an apparatus for diagnosing an abnormality of a battery cell according to an exemplary embodiment of the present disclosure.

As shown in FIG. 4, in the first battery cell, the relative comparison value of the ICA value in the first voltage section is 100%, the relative comparison value of the ICA value in the second voltage section is 100.1%, the relative comparison value of the ICA value in the third voltage section is 99.8%, the relative comparison value of the ICA value in the fourth voltage section is 99.9%, and the relative comparison value of the ICA value in the fifth voltage section is 101%.

In the second battery cell, the relative comparison value of the ICA value in the first voltage section is 98%, the relative comparison value of the ICA value in the second voltage section is 99%, the relative comparison value of the ICA value in the third voltage section is 97%, the relative comparison value of the ICA value in the fourth voltage section is 99.2%, and the relative comparison value of the ICA value in the fifth voltage section is 100%.

In the third battery cell, the relative comparison value of the ICA value in the first voltage section is 100.5%, the relative comparison value of the ICA value in the second voltage section is 101%, the relative comparison value of the ICA value in the third voltage section is 100%, the relative comparison value of the ICA value in the fourth voltage section is 100%, and the relative comparison value of the ICA value in the fifth voltage section is 100.8%.

The controller 30 may obtain a relative comparison value DDQT of the ICA value for each section based on following Equation 1.

$$DDQT = \left( \frac{(a_1 - A)}{A} \times 100 \right) + 100 \qquad \text{[Equation 1]}$$

11

Where 'A' represents an average of an ICA value of each battery cell for each section, and α₁ represents an ICA value of an arbitrary battery cell.

For example, when it is assumed that there are a total of 3 battery cells, the ICA value of the first battery cell in the first voltage section is 9, the ICA value of the second battery cell in the first voltage section is 11, and the ICA value of the third battery cell in the first voltage section is 11, 'A' is equal to 10. Therefore, the relative comparison value of the ICA value of the first battery cell in the first voltage section is 90%, the relative comparison value of the ICA value of the second battery cell in the first voltage section is 110%, and the relative comparison value of the ICA value of the third battery cell in the first voltage section is 110%.

As an exemplary embodiment of the present disclosure, when there are a total of 100 battery cells, the ICA values of each battery cell in the first voltage section may be sorted in ascending order, and the ICA average value may also be obtained using 90 ICA values except for the five smallest ICA values and the five largest ICA values.

As shown in FIG. 4, the controller 30 may diagnose whether a battery cell is abnormal in various manners as follows in a state where the relative comparison value of the ICA value for each voltage section is determined.

As various exemplary embodiments of the present disclosure, when charging the plurality of battery cells 210 in the first SOC section (e.g., a voltage section of 3.45 V to 4.18 V), the controller 30 may count the relative comparison value exceeding the first threshold value (e.g., 105%) among the relative comparison values of the ICA values for each voltage section, and diagnose that an abnormality occurs in the battery cell 210 whose counting number exceeds the reference number.

As various exemplary embodiments of the present disclosure, when charging the plurality of battery cells 210 in the second SOC section within the first SOC section, the controller 30 may diagnose that an abnormality occurs in the battery cell 210 in which a relative comparison value that exceeds a second threshold value (e.g., 110%) among the relative comparison values of the ICA values for each voltage section exists.

As various exemplary embodiments of the present disclosure, in the state where the relative comparison value of the first ICA value for each voltage section is determined in the previous charging process and the relative comparison value of the second ICA value for each voltage section is determined in the current charging process, the average of the differences between the relative comparison values of the first ICA value and the relative comparison values of the second ICA value may be determined, the score corresponding to the amount of change in the relative comparison value of the ICA value of each battery cell 210 may be determined, and it may be diagnosed that an abnormality has occurred in the battery cell 210 in which the cumulative score exceeds the reference value.

For example, when 'x' is the amount of change in the relative comparison value of the ICA value of each battery cell 210 compared to the average, the controller 30 may be configured to determine the score as 1 point when 'x' exceeds 1.2 and is less than or equal to 1.4, may be configured to determine the score as 2 points when 'x' exceeds 1.4 and less than or equal to 1.6, and may be configured to determine the score as 3 points when 'x' exceeds 1.6.

In the instant case, the controller 30 may be configured to generate a table as shown in FIG. 5.

FIG. 5 is a diagram illustrating an example of a table showing relative comparison values of ICA values of each battery cell in a first voltage section for each number of charging times generated by a controller provided in an apparatus for diagnosing an abnormality of a battery cell according to an exemplary embodiment of the present disclosure.

As shown in FIG. 5, the table for the first voltage section illustrates that the relative comparison value of the ICA value of the first battery cell during the first charge is 99.8% and the relative comparison value of the ICA value of the second battery cell is 99.9%. During the second charge, the relative comparison value of the ICA value of the first battery cell is 99.9% and the relative comparison value of the ICA value of the second battery cell is 97.9%.

In FIG. 5, a table for the first voltage section is used as an example to aid understanding, but the controller 30 may be configured to generate a table in the form shown in FIG. 5 for all voltage sections.

As various exemplary embodiments of the present disclosure, in a state where the plurality of battery cells 210 are charged a reference number of times (e.g., 10 times), a score corresponding to the number (N) of relative comparison values of the continuously increasing or decreasing ICA values may be determined for each voltage section, and it may be diagnosed that an abnormality occurs in the battery cell 210 in which the cumulative score for each voltage section exceeds a reference value.

For example, the controller 30 may be configured to determine the score as 1 point when 'N' is 3, determine the score as 2 points when 'N' is 4, and determine the score as 3 points when 'N' is 5 or more.

As an exemplary embodiment of the present disclosure, when the slope of the relative comparison value of the continuously increasing or decreasing ICA value exceeds a reference angle (e.g., 10 degrees), the controller 30 may be configured to determine the score as 2 points when 'N' is 3, determine the score as 4 points when 'N' is 4, and determine (given) the score as 6 points when 'N' is 5 or more. In the instant case, the controller 30 may be configured to generate the slope of a straight line passing through the relative comparison value of the first ICA value and the relative comparison value of the last ICA value.

As various exemplary embodiments of the present disclosure, in a state in which the plurality of battery cells 210 are charged a reference number of times, the relative comparison value of the ICA value which is out of the reference range may be counted for each voltage section, a score corresponding to the counting value (M) may be determined, and it may be diagnosed that an abnormality occurs in the battery cell 210 in which the cumulative score for each voltage section exceeds a reference value. In the instant case, the reference range may be aσ, where 'a' is a natural number and 'σ' represents a standard deviation.

For example, the controller 30 may be configured to determine the score as 2 points when 'M' is 4 or 5, determine the score as 3 points when 'M' is 6 or 7, and determine the score as 4 points when 'M' exceeds 7.

In various exemplary embodiments of the present disclosure, when charging the plurality of battery cells 210, the process of generating an ICA profile corresponding to each battery cell 210 by the controller 30 has been described, but when discharging the plurality of battery cells 210 in the same manner, the controller 30 may be configured to generate an ICA profile corresponding to each battery cell 210.

Figure 6:
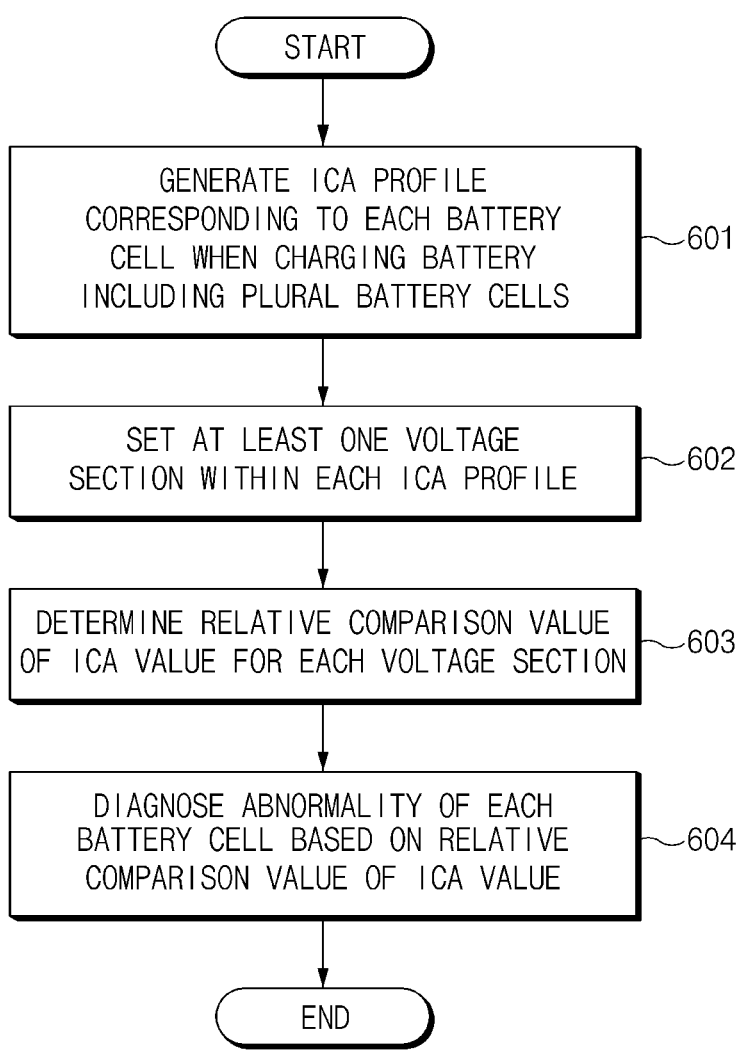
FIG. 6 is a flowchart illustrating a method of diagnosing an abnormality of a battery cell according to an exemplary embodiment of the present disclosure.

FIG. 6 is a flowchart illustrating a method of diagnosing an abnormality of a battery cell according to an exemplary embodiment of the present disclosure.

First, when charging the battery 200 including the plurality of battery cells 210, the controller 30 generates the ICA profile corresponding to each battery cell 210 in 601.

Accordingly, the controller 30 sets at least one voltage section within each ICA profile in 602.

Accordingly, the controller 30 is configured to determine the relative comparison value of the ICA value for each voltage section in 603.

Accordingly, the controller 30 diagnoses an abnormality of each battery cell 210 based on the relative comparison value of the ICA value in 604.

Figure 7:
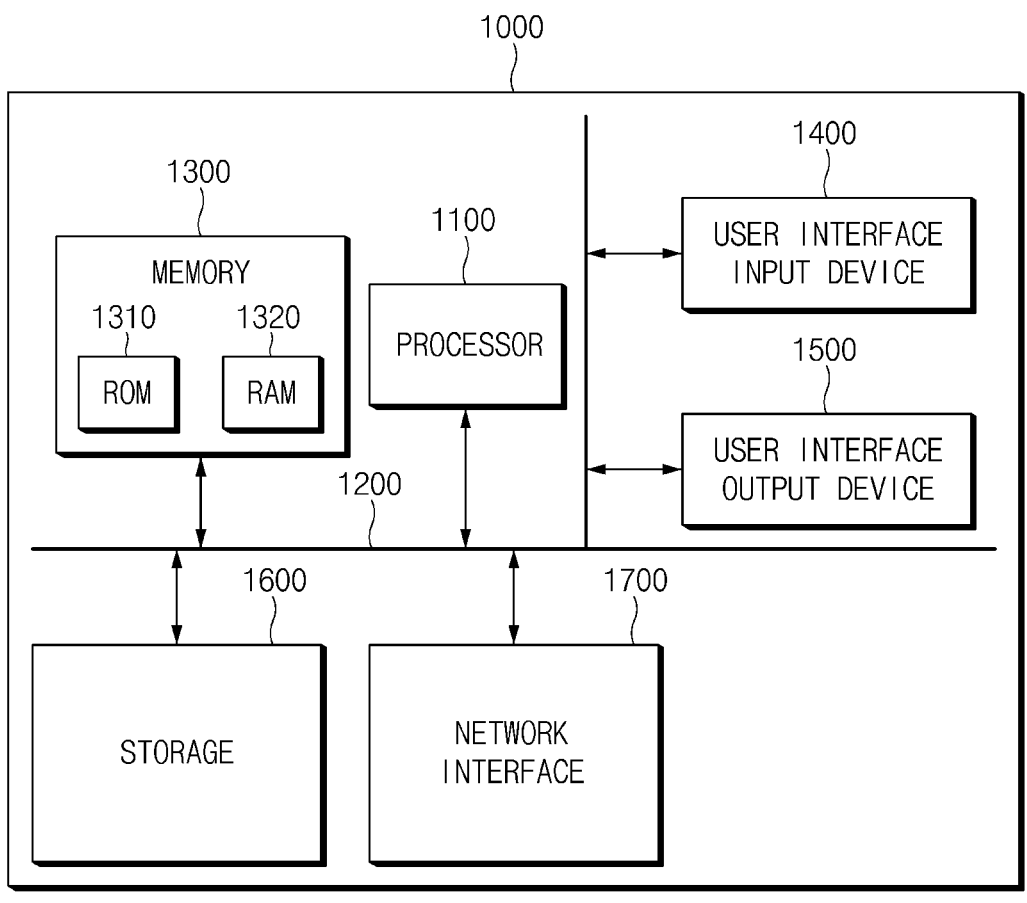
FIG. 7 is a block diagram illustrating a computing system for executing a method of diagnosing an abnormality of a battery cell according to various exemplary embodiments of the present disclosure.

FIG. 7 is a block diagram illustrating a computing system for executing a method of diagnosing an abnormality of a battery cell according to various exemplary embodiments of the present disclosure.

Referring to FIG. 7, a method of diagnosing an abnormality of a battery cell according to an exemplary embodiment of the present disclosure described above may be implemented through a computing system 1000. The computing system 1000 may include at least one processor 1100, a memory 1300, a user interface input device 1400, a user interface output device 1500, storage 1600, and a network interface 1700 connected through a system bus 1200.

The processor 1100 may be a central processing unit (CPU) or a semiconductor device that processes instructions stored in the memory 1300 and/or the storage 1600. The memory 1300 and the storage 1600 may include various types of volatile or non-volatile storage media. For example, the memory 1300 may include a Read-Only Memory (ROM) 1310 and a Random Access Memory (RAM) 1320.

Accordingly, the processes of the method or algorithm described in relation to the exemplary embodiments of the present disclosure may be implemented directly by hardware executed by the processor 1100, a software module, or a combination thereof. The software module may reside in a storage medium (that is, the memory 1300 and/or the storage 1600), such as a RAM, a flash memory, a ROM, an EPROM, an EEPROM, a register, a hard disk, solid state drive (SSD), a detachable disk, or a CD-ROM. The exemplary storage medium is coupled to the processor 1100, and the processor 1100 may read information from the storage medium and may write information in the storage medium. In another method, the storage medium may be integrated with the processor 1100. The processor 1100 and the storage medium may reside in an application specific integrated circuit (ASIC). The ASIC may reside in a user terminal. In another method, the processor and the storage medium may reside in the user terminal as an individual component.

According to the exemplary embodiments of the present disclosure, it is possible to prevent thermal runaway of the battery cell in advance by generating an incremental capacity analysis (ICA) profile corresponding to each battery cell in a process of charging a plurality of battery cells, setting at least one voltage section within each ICA profile, determining a relative comparison value of an ICA value for each voltage section, and diagnosing an abnormality of each battery cell 210 based on the relative comparison value of the ICA value.

In various exemplary embodiments of the present disclosure, each operation described above may be performed by a control device, and the control device may be configured by a plurality of control devices, or an integrated single control device.

In various exemplary embodiments of the present disclosure, the memory and the processor may be provided as one chip, or provided as separate chips.

In various exemplary embodiments of the present disclosure, the scope of the present disclosure includes software or machine-executable commands (e.g., an operating system, an application, firmware, a program, etc.) for enabling operations according to the methods of various embodiments to be executed on an apparatus or a computer, a non-transitory computer-readable medium including such software or commands stored thereon and executable on the apparatus or the computer.

In various exemplary embodiments of the present disclosure, the control device may be implemented in a form of hardware or software, or may be implemented in a combination of hardware and software.

Furthermore, the terms such as "unit", "module", etc. included in the specification mean units for processing at least one function or operation, which may be implemented by hardware, software, or a combination thereof.

In an exemplary embodiment of the present disclosure, the vehicle may be referred to as being based on a concept including various means of transportation. In some cases, the vehicle may be interpreted as being based on a concept including not only various means of land transportation, such as cars, motorcycles, trucks, and buses, that drive on roads but also various means of transportation such as airplanes, drones, ships, etc.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The term "and/or" may include a combination of a plurality of related listed items or any of a plurality of related listed items. For example, "A and/or B" includes all three cases such as "A", "B", and "A and B".

In the present specification, unless stated otherwise, a singular expression includes a plural expression unless the context clearly indicates otherwise.

In exemplary embodiments of the present disclosure, "at least one of A and B" may refer to "at least one of A or B" or "at least one of combinations of one or more of A and B". In addition, "one or more of A and B" may refer to "one or more of A or B" or "one or more of combinations of one or more of A and B".

In the exemplary embodiment of the present disclosure, it should be understood that a term such as "include" or "have" is intended to designate that the features, numbers, steps, operations, elements, parts, or combinations thereof described in the specification are present, and does not preclude the possibility of addition or presence of one or more other features, numbers, steps, operations, elements, parts, or combinations thereof.

According to an exemplary embodiment of the present disclosure, components may be combined with each other to be implemented as one, or some components may be omitted.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. An apparatus for diagnosing an abnormality of a battery cell, the apparatus comprising:

a battery including a plurality of battery cells; and a controller configured to generate an incremental capacity analysis (ICA) profile representing an amount of change in capacity compared to an amount of change in voltage of each battery cell in charging the battery, set at least one voltage value section within each ICA profile, determine a relative comparison value (RCA) of an ICA value for each voltage value section, and diagnose an abnormality of each battery cell based on the relative comparison value of the ICA value, wherein the controller is configured to obtain the RCV of the ICA value for each voltage value section based on following Equation 1, $$RCV = \left( \frac{(a_1 - A)}{A} \times 100 \right) + 100 \qquad \text{[Equation 1]}$$

where 'A' represents an average of the ICA value of each battery cell for each voltage value section, and $a_1$ represents an ICA value of an arbitrary battery cell, and wherein the controller is further configured to count a relative comparison value that exceeds a first threshold value among relative comparison values of ICA values for each voltage value section, and diagnose that an abnormality occurs in a battery cell whose counting number exceeds a reference number, among the plurality of battery cells.

2. The apparatus of claim 1, wherein the controller is further configured to diagnose that an abnormality occurs in a battery cell in which a relative comparison value that exceeds a second threshold value among relative comparison values of ICA values for each voltage value section exists, among the plurality of battery cells.

3. The apparatus of claim 1, wherein the controller is further configured to determine an average of difference values between a relative comparison value of the ICA value for each voltage value section determined during previous charging of the battery and a relative comparison value of the ICA value for each voltage value section determined during current charging of the battery, determine a score corresponding to an amount of change in the relative comparison value of the ICA value with respect to the average, and diagnose that an abnormality occurs in a battery cell whose cumulative score exceeds a reference value, among the plurality of battery cells.

4. The apparatus of claim 3, wherein the controller is further configured to assign a higher score as the amount of change in the relative comparison value of the ICA value with respect to the average increases.

5. The apparatus of claim 1, wherein the controller is further configured to determine a score corresponding to a number (N) of relative comparison values of ICA values that continuously increase or decrease for each voltage value section in response that the battery is charged a reference number of times, and diagnose that an abnormality occurs in a battery cell in which a cumulative score for each voltage value section exceeds a reference value, among the plurality of battery cells.

6. The apparatus of claim 5, wherein the controller is further configured to assign a higher score as the number (N) increases.

7. The apparatus of claim 6, wherein the controller is further configured to assign the score by further considering a slope of the relative comparison values of the ICA values that continuously increase or decrease.

8. The apparatus of claim 1, wherein the controller is further configured to count the relative comparison value of the ICA value which is out of a reference range for each voltage value section in response that the battery is charged a reference number of times, determine a score corresponding to a counting value (M), and diagnose that an abnormality occurs in a battery cell in which a cumulative score for each voltage value section exceeds a reference value, among the plurality of battery cells.

9. The apparatus of claim 1, wherein the controller is further configured to set ranges of voltage value sections to be different from each other.

10. A method of diagnosing an abnormality of a battery cell, the method comprising:

generating, by a controller, an incremental capacity analysis (ICA) profile representing an amount of change in capacity compared to an amount of change in voltage of each battery cell in charging a battery including a plurality of battery cells;

setting, by the controller, at least one voltage value section within each ICA profile;

determining, by the controller, a relative comparison value of an ICA value for each voltage value section; and diagnosing, by the controller, an abnormality of each battery cell based on the relative comparison value of the ICA value, wherein the determining of the relative comparison value of the ICA value includes:

obtaining, by the controller, the relative comparison value (RCV) of the ICA value for each voltage value section based on following Equation 1, $$RCV = \left( \frac{(a_1 - A)}{A} \times 100 \right) + 100 \qquad \text{[Equation 1]}$$

where 'A' represents an average of the ICA value of each battery cell for each voltage value section, and $a_1$ represents an ICA value of an arbitrary battery cell, and wherein the diagnosing of the abnormality of each battery cell includes:

counting, by the controller, a relative comparison value that exceeds a first threshold value among relative comparison values of ICA values for each voltage value section; and diagnosing, by the controller, that an abnormality occurs in a battery cell whose counting number exceeds a reference number, among the plurality of battery cells.

11. The method of claim 10, wherein the diagnosing of the abnormality of each battery cell includes:

diagnosing, by the controller, that an abnormality occurs in a battery cell in which a relative comparison value that exceeds a second threshold value among relative comparison values of ICA values for each voltage value section exists, among the plurality of battery cells.

12. The method of claim 10, wherein the diagnosing of the abnormality of each battery cell includes:

determining, by the controller, an average of difference values between a relative comparison value of the ICA value for each voltage value section determined during previous charging of the battery and a relative comparison value of the ICA value for each voltage value section determined during current charging of the battery;

determining, by the controller, a score corresponding to an amount of change in the relative comparison value of the ICA value with respect to the average; and diagnosing, by the controller, that an abnormality occurs in a battery cell whose cumulative score exceeds a reference value, among the plurality of battery cells.

13. The method of claim 12, wherein the determining of the score includes:

assigning, by the controller, a higher score as the amount of change in the relative comparison value of the ICA value with respect to the average increases.

14. The method of claim 10, wherein the diagnosing of the abnormality of each battery cell includes:

determining, by the controller, a score corresponding to a number (N) of relative comparison values of ICA values that continuously increase or decrease for each voltage value section in response that the battery is charged a reference number of times; and diagnosing, by the controller, that an abnormality occurs in a battery cell in which a cumulative score for each voltage value section exceeds a reference value, among the plurality of battery cells.

15. The method of claim 14, wherein the determining of the score includes:

assigning, by the controller, a higher score as the number (N) increases.

16. The method of claim 15, wherein the assigning of the score includes:

assigning, by the controller, the score by further considering a slope of the relative comparison values of the ICA values that continuously increase or decrease.

17. The method of claim 10, wherein the diagnosing of the abnormality of each battery cell includes:

counting, by the controller, the relative comparison value of the ICA value which is out of a reference range for each voltage value section in response that the battery is charged a reference number of times;

determining, by the controller, a score corresponding to a counting value (M); and diagnosing, by the controller, that an abnormality occurs in a battery cell in which a cumulative score for each voltage value section exceeds a reference value, among the plurality of battery cells.

18. The method of claim 10, wherein the setting of the voltage value section includes:

setting, by the controller, ranges of each voltage value section differently from each other.

* * * * *